US012652897B2

(12) United States Patent
Seo et al.

(10) Patent No.: US 12,652,897 B2
(45) Date of Patent: Jun. 9, 2026

(54) INSULATION SHEET FOR DISPLAY LIGHT SOURCE, AND INSULATION LIGHT SOURCE MODULE, INSULATION BACKLIGHT UNIT, AND DISPLAY DEVICE COMPRISING SAME

(71) Applicant: AMOGREENTECH CO., LTD., Gimpo-si (KR)

(72) Inventors: In Yong Seo, Gimpo-si (KR); Dae Woo Son, Gimpo-si (KR); Jae Hyung Seo, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 356 days.

(21) Appl. No.: 18/281,318

(22) PCT Filed: Mar. 10, 2022

(86) PCT No.: PCT/KR2022/003342
§ 371 (c)(1),
(2) Date: Sep. 11, 2023

(87) PCT Pub. No.: WO2022/191626
PCT Pub. Date: Sep. 15, 2022

(65) Prior Publication Data
US 2024/0154081 A1      May 9, 2024

(51) Int. Cl.
*H10H 20/858*      (2025.01)
*H10W 90/00*      (2026.01)
(52) U.S. Cl.
CPC ........ *H10H 20/8581* (2025.01); *H10W 90/00* (2026.01)

(58) Field of Classification Search
CPC . H10H 20/8581; H10H 29/142; H10W 90/00; G02F 1/133603; G02F 1/133628;
(Continued)

(56) References Cited

U.S. PATENT DOCUMENTS

2014/0185323 A1*   7/2014   Chen ...................... G09F 13/04
                                                              362/624
2014/0370222 A1   12/2014   Kim et al.

FOREIGN PATENT DOCUMENTS

CN        103592796 A      2/2014
CN        106054450 A      10/2016
(Continued)

OTHER PUBLICATIONS

Machine Translation of JP2012151196 (Year: 2012).*

*Primary Examiner* — Julia Slutsker
(74) *Attorney, Agent, or Firm* — Bayramoglu Law Offices LLC

(57) ABSTRACT
An insulation sheet for a display light source is provided. An insulation sheet for a display light source according to an embodiment of the present invention is provided on an opposite surface opposite to a circuit board mounting surface on which multiple LED elements configuring a light source of a display are mounted while being spaced a predetermined interval apart from each other, so as to block heat generated from the multiple LED elements from being transmitted in a direction perpendicular to the opposite surface. Accordingly, the insulation sheet can minimize vertical transfer of received heat as well as reducing the heating level of the multiple LED elements, and is thus advantageous in minimizing or preventing heat transfer in an undesirable direction and/or of an undesirable amount.

12 Claims, 8 Drawing Sheets

(58) Field of Classification Search
CPC ......... G02F 1/133608; G02F 1/133317; G02F
1/133345
See application file for complete search history.

(56) References Cited

FOREIGN PATENT DOCUMENTS

| | | | |
|---|---|---|---|
| CN | 107436508 | A | 12/2017 |
| CN | 109143450 | A | 1/2019 |
| CN | 109283739 | A | 1/2019 |
| CN | 208987240 | U | 6/2019 |
| CN | 211607206 | U | 9/2020 |
| JP | 2012151196 | A | 8/2012 |
| KR | 20080037983 | A | 5/2008 |
| KR | 20110028824 | A | 3/2011 |
| KR | 20120073792 | A | 7/2012 |
| KR | 20130080418 | A | 7/2013 |
| KR | 20140019737 | A | 2/2014 |
| KR | 200478488 | Y1 | 10/2015 |
| KR | 20160018421 | A | 2/2016 |
| KR | 20160109929 | A | 9/2016 |
| KR | 20190020637 | A | 3/2019 |
| KR | 102059126 | B1 | 12/2019 |
| KR | 102164171 | B1 | 10/2020 |

* cited by examiner

INSULATION SHEET FOR DISPLAY LIGHT SOURCE, AND INSULATION LIGHT SOURCE MODULE, INSULATION BACKLIGHT UNIT, AND DISPLAY DEVICE COMPRISING SAME

CROSS REFERENCE TO THE RELATED APPLICATIONS

This application is the national stage entry of International Application No. PCT/KR2022/003342, filed on Mar. 10, 2022, which is based upon and claims priority to Korean Patent Application No. 10-2021-0030579 filed on Mar. 9, 2021, the entire contents of which are incorporated herein by reference.

TECHNICAL FIELD

The present invention relates to an insulation sheet, and more specifically to an insulation sheet for a display light source and an insulation light source module, a backlight unit and a display device including the same.

BACKGROUND ART

In addition to an increase in the IC circuit integration due to the advancement of industry, the heat output of various electronic components is increasing due to the complex structure of electronic devices, including hybrid packages, multi-modules and sealed integrated circuits, slim and miniaturized designs and high-performance trends.

Accordingly, it is emerging as an important task to effectively dissipate a lot of heat generated in a narrow space in the electronic device to prevent malfunction of the electronic component and damage to the component.

Meanwhile, in consideration of the performance and durability of the electronic device, heat generated from the electronic device must be discharged to the outside, but this causes a problem in that a lot of heat is detected in the housing of the electronic device or the vicinity of the electronic device.

Particularly, in recent years, as electronic devices are becoming slimmer or miniaturized, the gap between various components and housings in electronic devices is almost disappearing, and furthermore, as the number and types of various components required in high-performance electronic devices increase, heat generation becomes more severe, and thus, the temperature of the housing or its surroundings may cause discomfort to users who come into contact with electronic devices or cases are frequently happening in which the users misunderstand them as abnormal operation of electronic devices.

A typical example of such an electronic device is a display device. Although low-cost models are still being mass-produced for display devices, on one hand, as larger and higher performance is promoted, the display devices are designed to have more pixels in a limited area, and in conjunction with this, the size of the light source provided in one display device is also reduced, while the number of provided light sources is increasing.

As an example of this trend, in the case of a liquid crystal display device having a backlight unit employing a recently commercialized mini LED element as a light source, about 20,000 or more mini LED elements are mounted on the backlight unit, and an increase in luminance due to a large number of provided LED elements and an increase in contrast ratio due to individual control of LED elements in a backlight unit are known as advantages. However, the problem of heat generation due to the LED elements provided in more than 20,000 is serious, and as a result, a lot of heat is emitted to the rear surface of the liquid crystal display device, thereby increasing the user's discomfort or the risk of burns to the user.

In addition, it is expected that the problem of high heat transmitted from the backlight unit to the housing due to the LED device is expected to intensify in the trend of slimming and developing high-brightness LED devices to minimize the gap between the display device housing and display components.

Technical Problem

The present invention has been devised in consideration of the above points, and is directed to providing an insulation sheet which is capable of minimizing or preventing the conduction or radiation of heat to the upper part of the sheet by minimizing the vertical transfer of the received heat while reducing the heat generation level of the LED elements by receiving heat from a plurality of LED elements, which are heating elements, and is directed to providing an insulation sheet which is suitable for application to a display light source as an example.

Technical Solution

In order to solve the above-described problems, according to a first embodiment of the present invention, provided is an insulation sheet for a display light source which is provided on an opposite surface opposite to a circuit board mounting surface on which a plurality of LED elements configuring a light source of a display are mounted while being spaced a predetermined interval apart from each other, so as to block heat generated from the plurality of LED elements from being transmitted in a direction perpendicular to the opposite surface, including an insulation member which is a graphite sheet that includes a first surface perpendicular to the thickness direction and a second surface facing thereto, and has a function of minimizing heat transfer from the second surface toward a direction perpendicular thereto by moving the heat transferred toward the first surface adjacent to the adhesive member in a thickness direction and in a plane direction perpendicular to the thickness direction to lower the temperature of the LED element, and predominantly moving the heat in the plane direction rather than the thickness direction, wherein the insulation member minimizes overlap due to plane-direction spreading of the heat transferred from a plurality of LED elements, and has a set thickness in consideration of the interval between LED elements and the heating value of LED elements in order to transfer the received heat as much as possible in the thickness direction and accumulate the heat in the insulation sheet, and wherein the thickness is set in a range of 70 to 500 μm.

According to an exemplary embodiment of the present invention, the graphite sheet may include a natural graphite sheet.

In addition, the thickness of the insulation member may be 150 to 200 μm.

In addition, the insulation sheet may further include an adhesive member which is disposed on a first surface of the insulation member and attached to an opposite surface opposite to the circuit board mounting surface, and a protective member which is disposed on a second surface of the insulation member.

In addition, the length and width of each of the protective member and the adhesive member may be formed to be greater than the length and width of the insulation member such that four side surfaces that are parallel to the thickness direction of the insulation member are sealed through the protective member and the adhesive member.

In addition, according to a second embodiment of the present invention, provided is an insulation sheet for a display light source which is provided on an opposite surface opposite to a circuit board mounting surface on which a plurality of LED elements configuring a light source of a display are mounted while being spaced a predetermined interval apart from each other, so as to block heat generated from the plurality of LED elements from being transmitted in a direction perpendicular to the opposite surface, including an adhesive member which is a double-sided metal tape that is attached on the opposite surface opposite to the circuit board mounting surface and includes a metal substrate for forming a hot spot having an area larger than the mounting area for each LED device and having high-temperature reliability and an adhesive layer on both surfaces of the metal substrate; and an insulation member which is a graphite sheet that is disposed on the adhesive member and includes a first surface perpendicular to the thickness direction and a second surface facing thereto, and has a function of minimizing heat transfer from the second surface toward a direction perpendicular thereto by moving the heat transferred toward the first surface adjacent to the adhesive member in a thickness direction and in a plane direction perpendicular to the thickness direction to lower the temperature of the LED element, and predominantly moving the heat in the plane direction rather than the thickness direction, wherein the graphite sheet includes a natural graphite sheet, and wherein the insulation member and the metal substrate minimize overlap due to plane-direction spreading of the heat transferred from a plurality of LED elements, and have a set thickness in consideration of the interval between LED elements and the heating value of LED elements in order to transfer the received heat as much as possible in the thickness direction and accumulate the heat in the insulation sheet.

According to an exemplary embodiment of the present invention, the insulation member may be formed in a thickness range of 70 to 500 μm.

In addition, the thickness of the insulation member may be 150 to 200 μm.

In addition, the metal substrate may be a metal foil having at least one of copper foil and aluminum foil.

In addition, the thickness of the metal substrate may be 7 to 75 μm, the thickness of the adhesive layer may be 7 to 55 μm.

In addition, the insulation sheet may further include a protective member which is provided on the second surface of the insulation member.

In addition, the length and width of each of the protective member and the adhesive member may be formed to be greater than the length and width of the insulation member such that four side surfaces that are parallel to the thickness direction of the insulation member are sealed through the protective member and the adhesive member.

Further, in the first embodiment and the second embodiment of the present invention, the graphite sheet may be provided with a ratio (a/b) of thermal conductivity (a) in the plane direction to thermal conductivity (b) in the thickness direction of 100 or less, in order to minimize the heat, which is transferred from any one LED element and each of the other LED elements disposed adjacent thereto to be transferred in each plane direction, from overlapping each other.

In addition, the insulation sheet may further include an adhesive layer for fixing to the insulation member on one surface of the protective film, wherein the protective member may be a protective film which includes at least one selected from the group consisting of polyimide, polyethylene terephthalate (PET) and polyethylene naphthalate (PEN).

In addition, the protective member may have a thickness of 50 to 200 μm.

In addition, the adhesive member may further include a release film on an opposite surface opposite to one surface in contact with the insulation member.

In addition, the present invention provides an insulation light source module, including a circuit board; a plurality of LED elements which are mounted on one surface of the circuit board at predetermined intervals from each other; and the insulation sheet for a display light source according to the present invention, wherein an adhesive member is disposed on an opposite surface opposite to one surface of the circuit board.

In addition, the plurality of LED elements may be mini LED elements or micro LED elements.

In addition, the insulation sheet for a display light source may be disposed by one sheet or several sheets in order to cover the opposite surface corresponding to the position of the plurality of LED elements.

In addition, the present invention provides an insulation backlight unit, including the insulation light source module according to the present invention; and several optical sheets which are disposed on a light exit surface of the light source module.

According to an exemplary embodiment of the present invention, the insulation backlight unit may further include a lower case for accommodating part or all of a side surface of the insulation light source module and one surface on the side of the insulation sheet in the insulation light source module, wherein the insulation sheet and the lower case are spaced apart such that an air layer is formed between the insulation sheet and the lower case.

In addition, the present invention provides a liquid crystal display device, including the insulation backlight unit according to the present invention; and a liquid crystal display panel which is disposed on a light exit surface of the insulation backlight unit.

In addition, the present invention provides a light-emitting display device, including the insulation light source module according to the present invention.

According to an exemplary embodiment of the present invention, the LED element included in the insulation light source module may be an LED element emitting white, UV or blue light, and may further include a color conversion unit which is disposed on a path of light emitted from the insulation light source module.

Alternatively, the plurality of LED elements included in the insulation light source module may include LED elements emitting red, green and blue light.

Advantageous Effects

The insulation sheet according to the present invention can minimize vertical transfer of received heat as well as reducing the heating level of LED elements by receiving heat generated from a plurality of LED elements that are employed as a display light source, and is thus advantageous in minimizing or preventing heat transfer in an undesirable direction and/or of an undesirable amount, and accordingly, it is very suitable for blocking heat generated from a plurality of LED elements from being transferred to the housing. In addition, the insulation sheet according to an exemplary embodiment of the present invention can prevent dust that may be generated due to damage or destruction of the inner layer of the insulation sheet from scattering, thereby preventing malfunction or damage of the display device due to the dust, and thus, it can be widely applied to various types of display devices.

BRIEF DESCRIPTION OF THE DRAWINGS

FIGS. 1 to 4B are cross-sectional mimetic diagrams of insulation sheets according to various exemplary embodiments of the present invention.

DETAILED DESCRIPTION OF THE EMBODIMENTS

Figure 3:
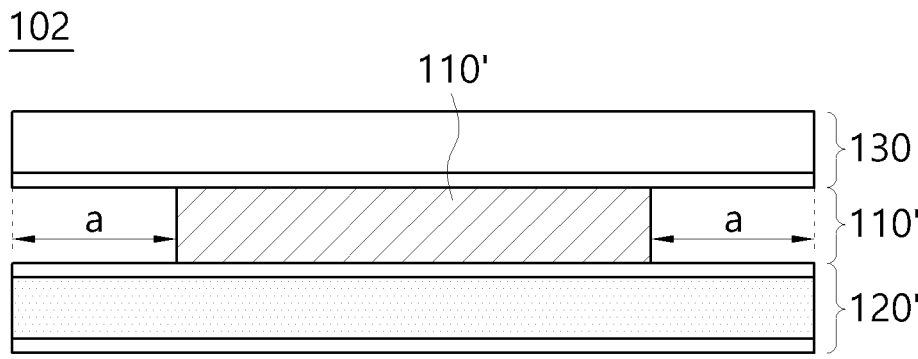

The insulation sheet according to the present invention is an insulation sheet for a display light source which is provided on an opposite surface opposite to a circuit board mounting surface on which a plurality of LED elements configuring a light source of a display are mounted while being spaced a predetermined interval apart from each other, so as to block heat generated from the plurality of LED elements from being transmitted in a direction perpendicular to the opposite surface.

Figures 1, 2:
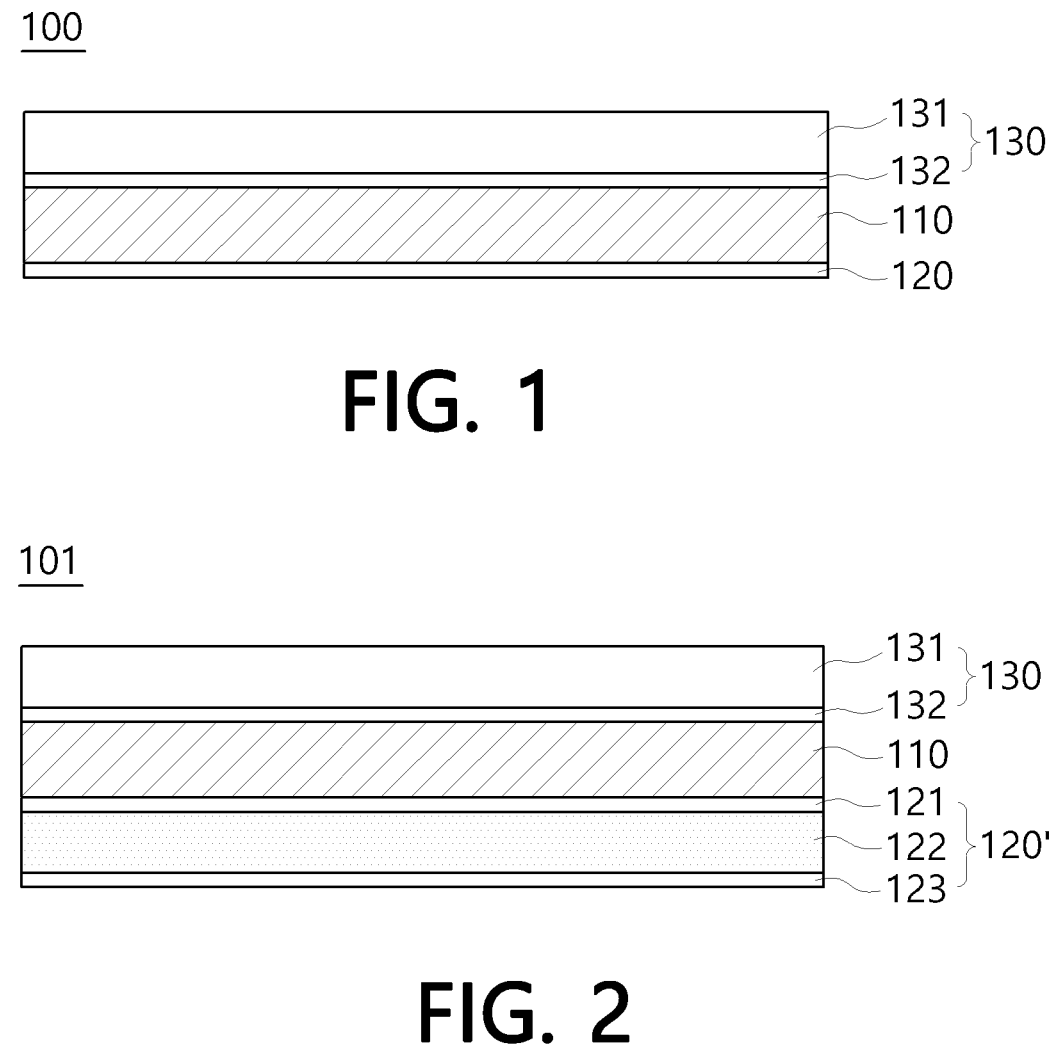

When it is described with reference to FIG. 1, the insulation sheet 100 according to a first embodiment of the present invention includes an insulation member 110 including a first surface perpendicular to the thickness direction and a second surface facing thereto, and may further include a protective member 130 which is provided on a second surface of the insulation member 110 and an adhesive member 120 which is provided on a first surface of the insulation member 110.

The insulation member 110 exhibits a heat dissipation effect of lowering the temperature of the LED element by moving the heat transferred toward the first surface adjacent to the LED element in the thickness direction from the first surface to the second surface and in the plane direction perpendicular to the thickness direction, and also simultaneously exhibits a heat insulation effect of minimizing heat transfer from the second surface toward a direction perpendicular thereto by predominantly moving heat in the plane direction rather than the thickness direction, and to this end, the insulation member 110 is implemented as a graphite sheet. In this case, the insulation member 110 minimizes overlap due to plane-direction spreading of the heat transferred from a plurality of LED elements, and has a set thickness in consideration of the interval between LED elements and the heating value of LED elements in order to transfer the received heat as much as possible in the thickness direction and accumulate the heat in the insulation sheet, and the thickness is set in a range of 70 to 500 μm.

When the insulation mechanism of the insulation sheet 100 is described in detail, the heat reaching the first surface of the insulation member 110 from a plurality of LED elements, which are hot spots, through the adhesive member 120 moves more heat in the plane direction rather than in the thickness direction until the thermal capacity of the insulation member 110 is saturated due to the thermal conductivity of the insulation member 110 that is predominantly expressed in the plane direction perpendicular to the thickness direction. This heat conduction tendency exhibits a heat insulation effect of minimizing or preventing heat transfer from the second surface of the insulation sheet 100 toward a direction perpendicular thereto by minimizing heat movement from the first surface of the insulation member 110 to the thickness direction of the second surface, and also exhibits a heat dissipation effect of lowering the temperature of the LED elements, which are heating elements.

The insulation member 110 is implemented as a graphite sheet, and it may be a single graphite sheet or a plurality of laminated graphite sheets. In this case, when the insulation member 110 is made of a single graphite sheet, the heat conduction property of the insulation member 110 may be the heat conduction property of the single graphite sheet. However, when the insulation member 110 is in the form of several laminated graphite sheets or includes other layers such as an adhesive layer in addition to the graphite sheet, there is no limitation as long as the entire combined insulation member satisfies the heat conduction characteristics of the above-described insulation member 110.

In addition, the insulation member 110 minimizes overlap due to plane-direction spreading of the heat transferred from a plurality of LED elements, and has a set thickness in consideration of the interval between LED elements and the heating value of LED elements in order to transfer the received heat as much as possible in the thickness direction and accumulate the heat in the insulation sheet, and through this, the insulation sheet may achieve a minimum thickness increase for the improvement of the insulation effect, and as the use of an excessively thick graphite sheet is prevented, in the backlight unit provided with the insulation sheet, it is advantageous to create a separated space in which an air layer is formed between the insulation sheet and the lower case, and as the insulation effect due to the air layer increases, it is possible to minimize the transfer of heat from the backlight unit to the lower case.

In this case, the thickness of the insulation member 110 may be set in a range of 70 to 500 μm, and if the thickness is less than 70 μm, the time for expressing the heat insulation effect for a lot of heat generated from a plurality of LED devices is shortened, and thus, it may be difficult to express the sufficient insulation effect. In addition, if the thickness is more than 500 μm, the heat capacity increases, which is advantageous to improve the heat dissipation effect for the LED element and the heat insulation effect due to the insulation sheet, but in the case of an artificial graphite sheet, it is not easy to manufacture with such a thickness. Further, in the case of a natural graphite sheet, the thermal conductivity in the thickness direction may decrease, and as a result, the heat conduction in the plane direction becomes more dominant, and the heat derived from each adjacent LED element is transferred in the plane direction, and whereas the overlap occurs faster, the heat movement in the thickness direction is slow, and thus, the movement of heat generated from the LED element is not smooth, and the heat dissipation performance of the LED element may be deteriorated. In addition, when applied to the adhesion surface having a curvature or a step, damage such as cracks may occur in the insulation member, and the generated damage may reduce the heat dissipation and/or heat insulation effect. Moreover, there is a risk of causing an electrical short in the surrounding electrical and electronic components due to the scattering of dust generated due to the damage. In addition, there is a possibility that peeling and lifting may occur at the interface between various members constituting the insulation sheet.

The graphite sheet may specifically include a natural graphite sheet, an artificial graphite sheet and/or a multi-layered graphene sheet.

However, in order to receive heat generated from a plurality of LED elements quickly and greatly while moving the same in the thickness direction at an appropriate speed and an appropriate amount, and conduct or radiate heat from the second surface of the insulating member to the upper direction perpendicular to the surface, the graphite sheet needs to be thicker than a predetermined thickness while the ratio of the thermal conductivity in the thickness direction to the thermal conductivity in the plane direction of the graphite sheet is appropriate. However, in the case of artificial graphite sheets or multi-layer graphene sheets, compared to the thermal conductivity in the thickness direction, the thermal conductivity in the plane direction is too large, and it is not easy to manufacture a thickness exceeding a certain thickness, for example, 50 μm, or 60 μm, 70 μm or 80 μm, and even if it can be manufactured, there is a problem in that it is difficult to use because the unit cost is very high.

Preferably, the graphite sheet may include a natural graphite sheet. In the case of the natural graphite, since it can be used without limitation in the case of conventionally commercialized graphite or graphite that is referred to as natural graphite, the present invention omits the detailed description thereof.

According to an exemplary embodiment of the present invention, the graphite sheet, which is the insulation member 110, may be provided with a ratio (a/b) of thermal conductivity (a) in the plane direction to thermal conductivity (b) in the thickness direction of 100 or less, as another example, 90 or less, 80 or less, 70 or less, 60 or less, 50 or less, or 40 or less, in order to minimize the heat, which is transferred from any one LED element and each of the other LED elements disposed adjacent thereto to be transferred in each plane direction, from overlapping each other. In addition, it may be provided with a ratio (a/b) of thermal conductivity (a) in the plane direction to thermal conductivity (b) in the thickness direction of 20 or more, and as another example, 30 or more.

Next, the insulation sheet 100 may further include an adhesive member 120 which is provided under the above-described insulation member 110 and a protective member 130 which is provided above the insulation member 110.

The adhesive member 120 is for attaching the insulation sheet 100 to the opposite surface opposite to one surface of the circuit board on which a plurality of LED elements are mounted, which is the adhesion surface, and it may be used without limitation in the case of known adhesive members. The adhesive member 120 may be formed of an adhesive layer as illustrated in FIG. 1 as an example.

The adhesive layer may be used without limitation, as long as it is an adhesive layer that can be used commonly in the art, and preferably, it may be formed as an adhesive layer-forming composition including an adhesive component including at least one selected from the group consisting of acrylic resin, urethane resin, epoxy resin, silicone rubber, acrylic rubber, carboxyl nitrile elastomer, phenoxy and polyimide resin, and more preferably, including acrylic resin. In addition, the adhesive layer-forming composition may further include a curing agent when the adhesive component is a curable resin, and it may further include additives such as a curing accelerator depending on the purpose. The curing agent may be used without limitation as long as it is a curing agent that can be commonly used in the art, and preferably, it may include at least one selected from the group consisting of an epoxy-based curing agent, a diisocyanate-based curing agent, a secondary amine-based curing agent, a tertiary amine-based curing agent, a melamine-based curing agent, an isocyanate-based curing agent and a phenol-based curing agent, more preferably, it may include an epoxy-based curing agent.

In addition, the adhesive layer may further include a known heat dissipation filler.

In addition, the adhesive layer may have a thickness of 7 to 55 μm, and preferably, 10 to 50 μm. If the thickness of the adhesive layer is less than 7 μm, interlayer adhesion may be reduced, and if the thickness is more than 55 μm, it is not preferable in terms of thinning, and considering the limited thickness of the insulating sheet 100, as the thickness of the insulation member 110 becomes relatively thin, the heat dissipation and/or heat insulation properties may be deteriorated.

Next, the protective member 130 provided on the second surface of the above-described insulation member 110 will be described. The protective member 130 functions to physically and chemically protect the insulation sheet 100. The protective member 130 may be employed without limitation in the case of the protective member 130 of a conventional sheet. For example, the protective member 130 may include a protective layer 131, and the protective layer 131 may be in the form of an inorganic porous film, a nanofiber web or a laminated inorganic film on a nanofiber web. In the case of the insulating sheet 100 illustrated in FIG. 1, it is a case in which an inorganic porous film is provided as the protective layer 131. and unlike this, when the nanofiber web is provided as a protective member, along with the protective function, it has the advantage of being able to express the heat insulation effect in the vertical direction through a plurality of pores that are provided in the nanofiber web.

The inorganic film may be a film including at least one selected from the group consisting of polyimide, polyethylene terephthalate (PET) and polyethylene naphthalate (PEN). In addition, the nanofiber web may be a nanofiber web that is formed of a known material such as a urethane-based material, a fluorine-based material or polyacrylonitrile. The diameter of the nanofibers in the nanofiber web may be 1 μm or less, but the present invention is not limited thereto.

The inorganic porous film or nanofiber web may have a thickness of 10 to 30 μm, and preferably, 13 to 25 μm. If the thickness is less than 10 μm, protection performance such as abrasion resistance may be reduced, and if the thickness is more than 30 μm, it is undesirable in terms of thinning, and flexibility may be reduced, which may lead to delamination.

Meanwhile, the protective member 130 may further include an adhesive layer 132 to be fixed on the insulation member 110. The adhesive layer 132 provided in the protective member 130 is the same as the description of the adhesive layer provided in the above-described adhesive member 120, and thus, the detailed description will be omitted, and in terms of material, it may be configured to be the same as or different from the adhesive layer provided in the adhesive member 120.

In addition, the length and width of each of the protective member 130 and the adhesive member 120 may be formed to be greater than the length and width of the insulation member 110 such that four side surfaces that are parallel to the thickness direction of the insulation member 110 are sealed through the protective member 130 and the adhesive member 120. However, as illustrated in FIG. 1, when the adhesive member 120 is made of only an adhesive layer, it may be difficult to seal the side surfaces of the insulation member 110 for a long period of time. compared to the insulation sheet 102 as illustrated in FIG. 3.

Next, the insulation sheet according to a second embodiment of the present invention will be described with reference to FIGS. 2 to 4B.

The insulation sheet 101 according to the second embodiment includes an insulation member 110 which is a double-sided metal tape and a graphite sheet as an adhesive member 120' attached to an opposite surface opposite to the circuit board mounting surface, and may further include a protective member 130 which is provided on the second surface of the insulation member 110.

The insulation member 110, which is the graphite sheet, and the protective member 130 are the same as the descriptions of the insulation member 110 and the protective member 130 in the insulation sheet 100 according to the first embodiment described above.

First of all, the adhesive member 120' is a double-sided metal tape including a metal substrate 122 for forming a hot spot having a larger area than the mounting area of each LED device and having high-temperature reliability, and adhesive layers 121, 123 on both surfaces of the metal substrate 122.

The adhesive layers 121, 123 provided on the adhesive member 120', which is the double-sided metal tape, may be known adhesive layers, and since they are the same as the description of the adhesive layer in the adhesive member 120 described above, the detailed description thereof will be omitted. In this case, the material, adhesive strength and/or thickness of the first adhesive layer 123 and the second adhesive layer 121 may be identical or different.

Figure 4A:
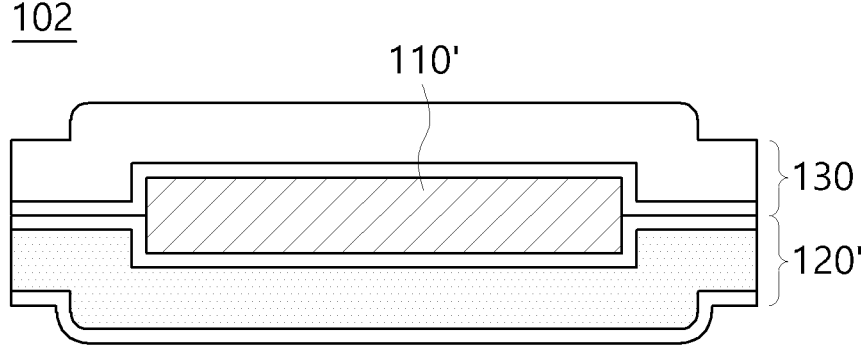
Figure 4B:
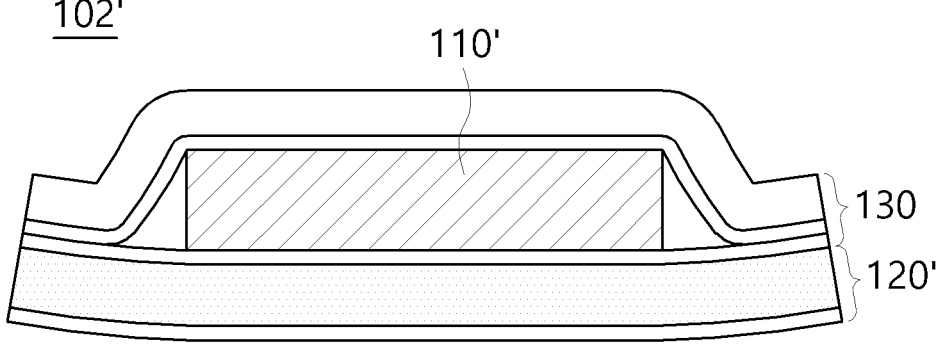

In addition, the adhesive member 120' is a double-sided metal tape including a metal substrate 122, and in this case, compared to the adhesive member 120 made of the adhesive layer illustrated in FIG. 1, the adhesion characteristics may be improved on the adhered surface having a curvature or step difference. In addition, as the metal substrate 122 is prevented from forming wrinkles due to heat transferred from a plurality of LED elements as a heating element, high-temperature reliability may be guaranteed. On the other hand, if a polymer film is used as the substrate, wrinkles occur due to high heat transferred from a plurality of LED elements, and as a result, there is a concern that lifting or peeling may occur at the interface between the adhered surface and the adhesive member 120' or between the adhesive member 120' and the insulation member 110, and thus, reliability at high temperature may be deteriorated. Moreover, as shown in FIGS. 4A and 4B, it is easier when forming an offset structure, and it may be advantageous to maintain the offset structure for a long period of time.

Figure 7:
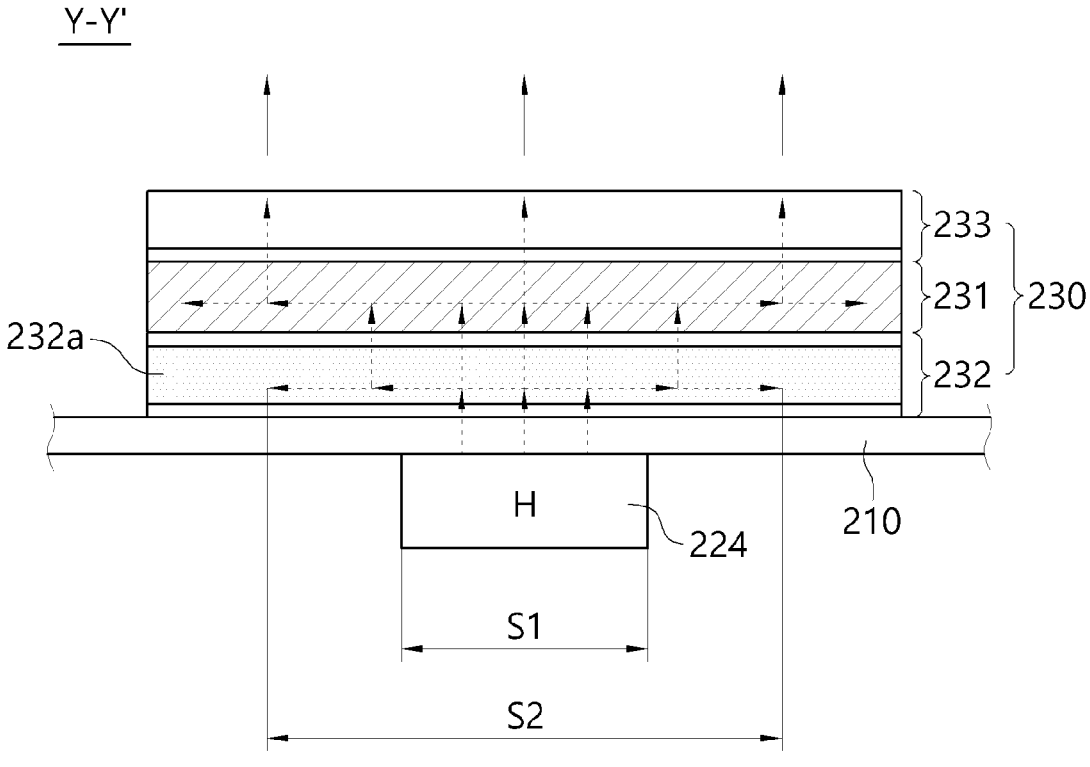

In addition, when the metal substrate 122 is used, the heat insulation performance of the insulation sheet 101 may be further improved. When this is explained with reference to FIG. 7, when the metal substrate 232a is provided on the adhesive member 232, before the heat (H) of the LED element 224 as a hot spot is transferred to the insulation member 231 due to the heat conduction characteristics of the metal substrate 232a, it may be primarily moved in a plane direction perpendicular to the thickness direction of the metal substrate 232a in the adhesive member 232. In this case, the area ($S_2$) of the hot spot formed on the metal substrate 232a on the basis of the insulation member 231 becomes larger than the mounting area ($S_1$) of the LED element, and as a result, the heat reaching the first surface of the insulation member 231 may be transferred faster and more in the plane direction perpendicular to the thickness direction of the insulation member 231. In addition, relatively, the amount of heat transferred may be further reduced in the thickness direction from the first surface to the second surface, and through this, since the heat transferred from the second surface of the insulation sheet 230 toward a direction perpendicular to the second surface may be further reduced, it is possible to exhibit a more improved heat insulation effect.

The metal substrate 122 may be used without limitation as long as it is a metal substrate commonly used in the art, and preferably, it may be any one of copper foil, aluminum foil, silver foil, nickel foil and gold foil, or an alloy including two or more thereof, or a metal film in which two or more thereof are mixed or two or more thereof are formed as individual layers and laminated. Preferably, the metal substrate 122 may be a metal foil including at least one of copper foil and aluminum foil.

Meanwhile, the metal substrate 122 may have a thickness of 7 to 75 μm, and preferably, 10 to 70 μm. If the thickness of the metal substrate 122 is less than 7 μm, the desired level of heat dissipation characteristics may not be expressed and a tear phenomenon may occur. In addition, if the thickness is more than 75 μm, as thinning of the insulation sheet becomes difficult and flexibility decreases, interlayer lifting and peeling may occur during bending, and thus, reliability may deteriorate.

In addition, the metal substrate 122 may have a predetermined surface roughness by forming irregularities on the surface in order to improve adhesion characteristics with the first adhesive layer 123 and/or the second adhesive layer 121, but the present invention is not limited thereto.

Meanwhile, in the second embodiment, the graphite sheet, which is the insulation member 110, includes a natural graphite sheet, minimizes overlap due to plane-direction spreading of heat transmitted from a plurality of LED devices, and has a set metal substrate thickness and graphite sheet thickness in consideration of the interval between the LED elements and the heating amount of the LED elements in order to accumulate the transferred heat in the thickness direction as much as possible. Through this, the insulation sheet may achieve a minimum increase in thickness to improve the insulation effect, and as the use of an excessively thick graphite sheet is prevented, it is advantageous to create a separated space in which an air layer is formed between the insulation sheet and the lower case in the backlight unit provided with the insulation sheet. In addition, as the heat insulation effect due to the air layer increases, it is possible to minimize the transfer of heat from the backlight unit toward the lower case.

Figure 6:
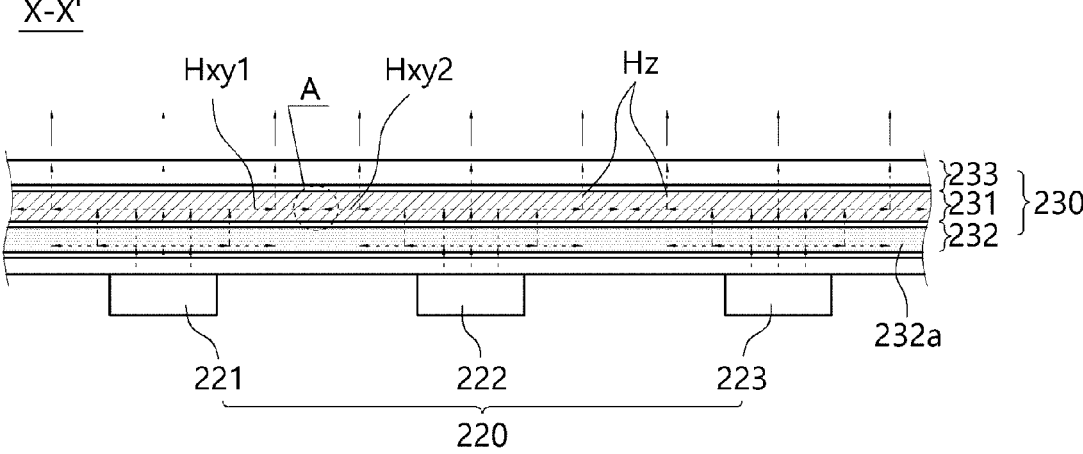
FIGS. 6 and 7 are cross-sectional mimetic diagrams illustrating the movement path of heat transferred from a plurality of LED elements, which are heating elements, in cross sections along the X-X' boundary line and the Y-Y' boundary line in FIG. 5, FIGS. 8A and 8B are exploded perspective views of insulation light source modules according to various exemplary embodiments of the present invention, showing that the insulation sheet is divided into a plurality of sheets.

Meanwhile, when the overlap according to the plane-direction spreading of heat received from a plurality of LED elements is described in detail with reference to FIG. 6, the heat generated from the first LED element 221, the second LED element 222 and the third LED element 223 reaches the adhesive member 232 via the circuit board 210, and the heat transferred from the metal substrate 232a in the adhesive member 232 is primarily spread in the plane direction to form a hot spot having an area larger than the mounting area of the LED device, and at the same time as part of the heat is spread in the plane direction, the remaining heat is transferred in the vertical direction to reach the first surface of the heat insulating member 231. The heat reaching the insulation member 231 spreads more rapidly in the plane direction than in the thickness direction due to heat conduction characteristics that are superior in the plane direction than in the thickness direction of the insulation member 231. In this case, in the case of the insulation member 231, which is a natural graphite sheet, the ratio of thermal conductivity in the plane direction to thermal conductivity in the thickness direction is small compared to the artificial graphite sheet, and as a result, the movement of heat occurs appropriately in the thickness direction within the insulation member 231, and the remaining heat is spread in the plane direction, and as a result, an overlap (A) between the plane-direction spreading ($H_{xy1}$) of heat derived from the first LED element 221 and the plane-direction spreading ($H_{xy2}$) of heat derived from the second LED element 222 may be minimized. However, as the heat moves in the thickness direction at an appropriate level ($H_z$), when the thickness of the insulation member 231 is thin, the heat capacity of the insulation member 231 is reached very quickly such it may be difficult to achieve heat radiation and heat insulation effects any longer, and thus, the insulation member 231 may have an appropriate thickness to have sufficient heat capacity in consideration of the interval between LED elements and the amount of heat generated by the LED elements, and since the metal substrate 232a also has an appropriate thickness, the insulation member 231 may continue to have a heat insulation effect and help to exert a heat radiation effect.

If the artificial graphite sheet is used as an insulation member, the thermal conductivity is too small in the thickness direction compared to the plane direction, and as a result, the movement of heat in the thickness direction within the insulation member 231 is very small such that most of the heat is spread in the plane direction, and in this case, an overlap (A) may occur in a very short period of time between the plane-direction spreading ($H_{xy1}$) of the heat originating from the first LED element 221 and the plane-direction spreading ($H_{xy2}$) of the heat originating from the second LED element 222. When the overlap of heat in the plane direction within the insulation member 231 increases, whereas it is difficult for the insulation member 231 to accept heat from the adhesive member 232 any longer, the amount of heat moving in the thickness direction is small, and thus, since it becomes difficult to continuously receive heat generated from the LED elements 221, 222, 223, it may be difficult to achieve a desired level of heat dissipation effect.

Meanwhile, as described above, the heat spreading in the plane direction is excellent, but since the heat must move in the thickness direction to an appropriate level, adjusting the ratio of thermal conductivity in the plane direction to thermal conductivity in the thickness direction of the graphite sheet used in the insulation member 231 to an appropriate level, for example, 100 or less may also be another method of minimizing the overlap due to the spreading of heat in the plane direction.

According to an exemplary embodiment of the present invention, in order to improve the adhesion characteristics on the adhered surface having a curvature or step difference, prevent peeling between layers in the insulation sheet, and prevent scattering of dust that may occur due to damage of the insulation member 110 that may occur at any time, the insulating sheets 102, 102' may have a structure as illustrated in FIGS. 3, 4A and 4B. Specifically, in the insulation sheet 102, the length and width of each of the protective member 130 and the adhesive member 120' may be formed to be greater than the length and width of each of the insulation members 110' by a predetermined size (a) such that four side surfaces parallel to the thickness direction of the insulation member 110' may be sealed through the protective member 130 and the adhesive member 120'. Meanwhile, the length and width of each of the insulation member 110', the protecting member 130 and the adhesive member 120' are not limited thereto, and may be appropriately changed in consideration of the area of the backlight unit, desired heat insulating performance and the like.

The above-described insulation sheets 100, 101, 102, 102' according to an exemplary embodiment of the present invention may be implemented as an insulation light source module for a display. When it is described with reference to FIGS. 5 to 7, the insulation light source module 200 is implemented by including a circuit board 210, a plurality of LED elements 220 mounted on one surface of the circuit board 210 at a predetermined distance from each other, and the above-described insulation sheet 230 for a display light source which is disposed such that the adhesive member is positioned on an opposite surface opposite to one surface of the circuit board.

Figure 5:
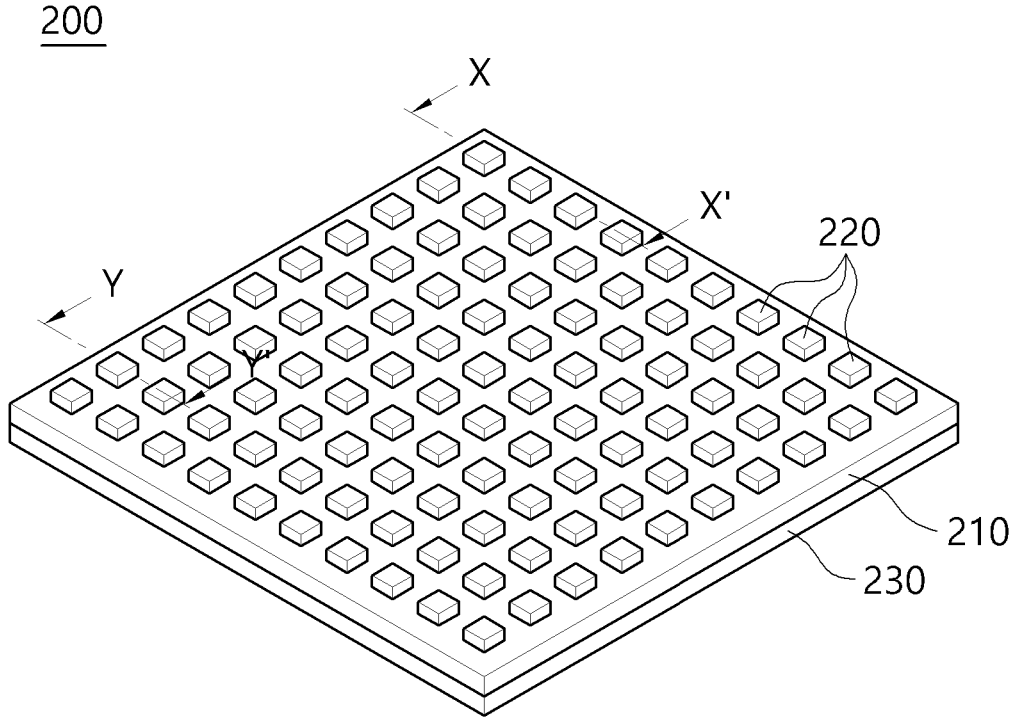
FIG. 5 is a perspective view of an insulation light source module employing the insulation sheet according to an exemplary embodiment of the present invention.

The plurality of LED elements 220 may be arranged in a tiled pattern as illustrated in FIG. 5 to implement a direct-type light source. In addition, the plurality of LED devices 220 may be a mini LED device or a micro LED device. The mini LED device and the micro LED device may be implemented with a length of each side of more than 100 μm to 500 μm. In addition, the micro LED device may be implemented with a length of each side of 100 μm or less. In addition, the LED elements 211, 212, 213, 214 may be of known LED materials and structures. The LED elements 211, 212, 213, 214 may be implemented with materials such as InGaN and GaN, for example, and may include an n-type semiconductor layer, a photoactive layer and a p-type semiconductor layer, and may further include an electrode layer and the like. In addition, the plurality of LED elements 220 may emit any one color in the visible light region, and for example, blue or UV.

Meanwhile, when the size of the LED devices 211, 212, 213, 214 is reduced like a mini LED device or a micro LED device, local dimming is possible. Local dimming may improve picture quality and save power. Herein, the local dimming is a technique for controlling the brightness of an LED used as a backlight based on a configuration or characteristic of a screen, and it is a technique that is capable of remarkably improving a contrast ratio and reducing power consumption. As an example of local dimming, dark colors are expressed by adjusting the brightness of the mini LED or micro LED corresponding to the dark screen to be relatively dark, and vivid colors may be expressed by relatively brightening the brightness of the mini LED or micro LED corresponding to the bright screen.

In addition, as an example, more than 15,000 mini LED devices may be provided on the circuit board, and in another example, more than 20,000.

In addition, the circuit board 210 may be a known circuit board used in a display light source module, and the present invention does not particularly limit the same.

Figure 8A:
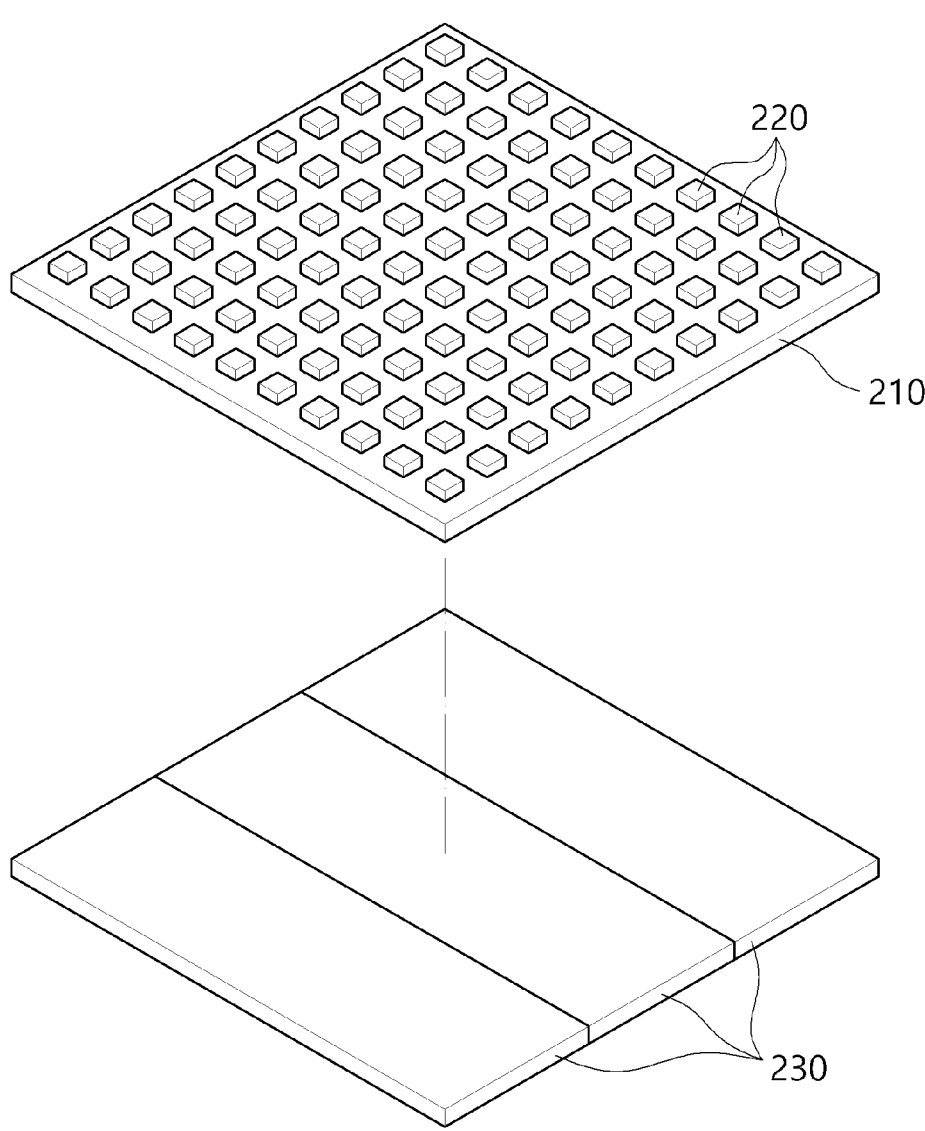
Figure 8B:
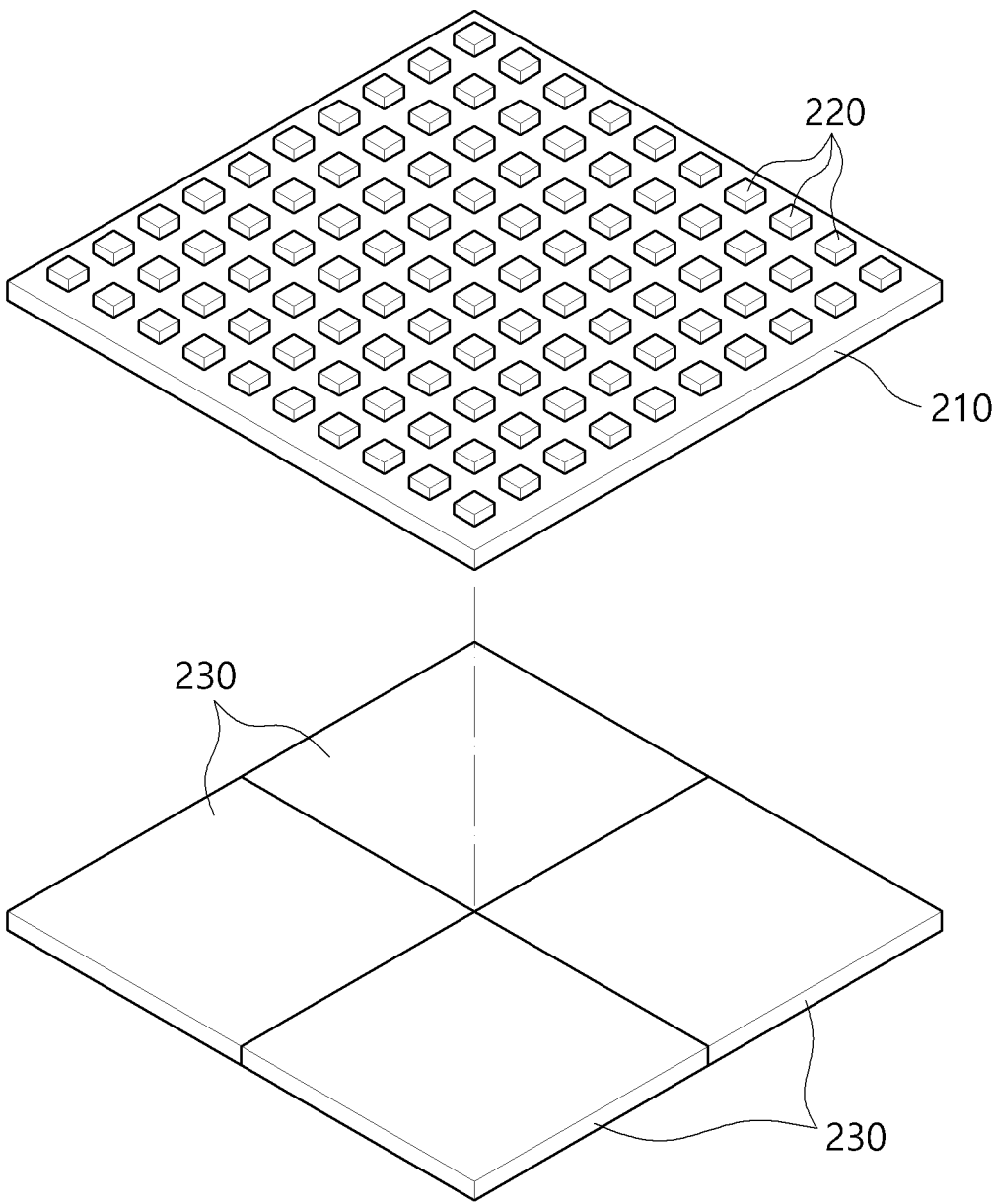

The insulation sheet 230 for a light source according to the present invention is arranged such that the above-described plurality of LED elements 220 are positioned on an opposite surface opposite to the surface mounted on the circuit board 210. In this case, as illustrated in FIG. 5, the insulation sheet 230 for a light source may implement light source modules 200' and 200" by arranging to cover the opposite surface corresponding to the position of the plurality of LED elements, or arranging several sheets to cover the opposite surface as illustrated in FIGS. 8A and 8B. This is because there is a limitation to the area in which the graphite sheet, which is the insulation member 110, can be manufactured, and in the case of a large-area display device, it may be difficult to cover all of the opposite surface with one insulating sheet, and accordingly, it may be designed to cover the opposite surface with several insulation sheets.

In addition, the present invention includes an insulation backlight unit 300 and a liquid crystal display device 1000 including the above-described insulation light source modules 200, 200', 200".

Figure 9:
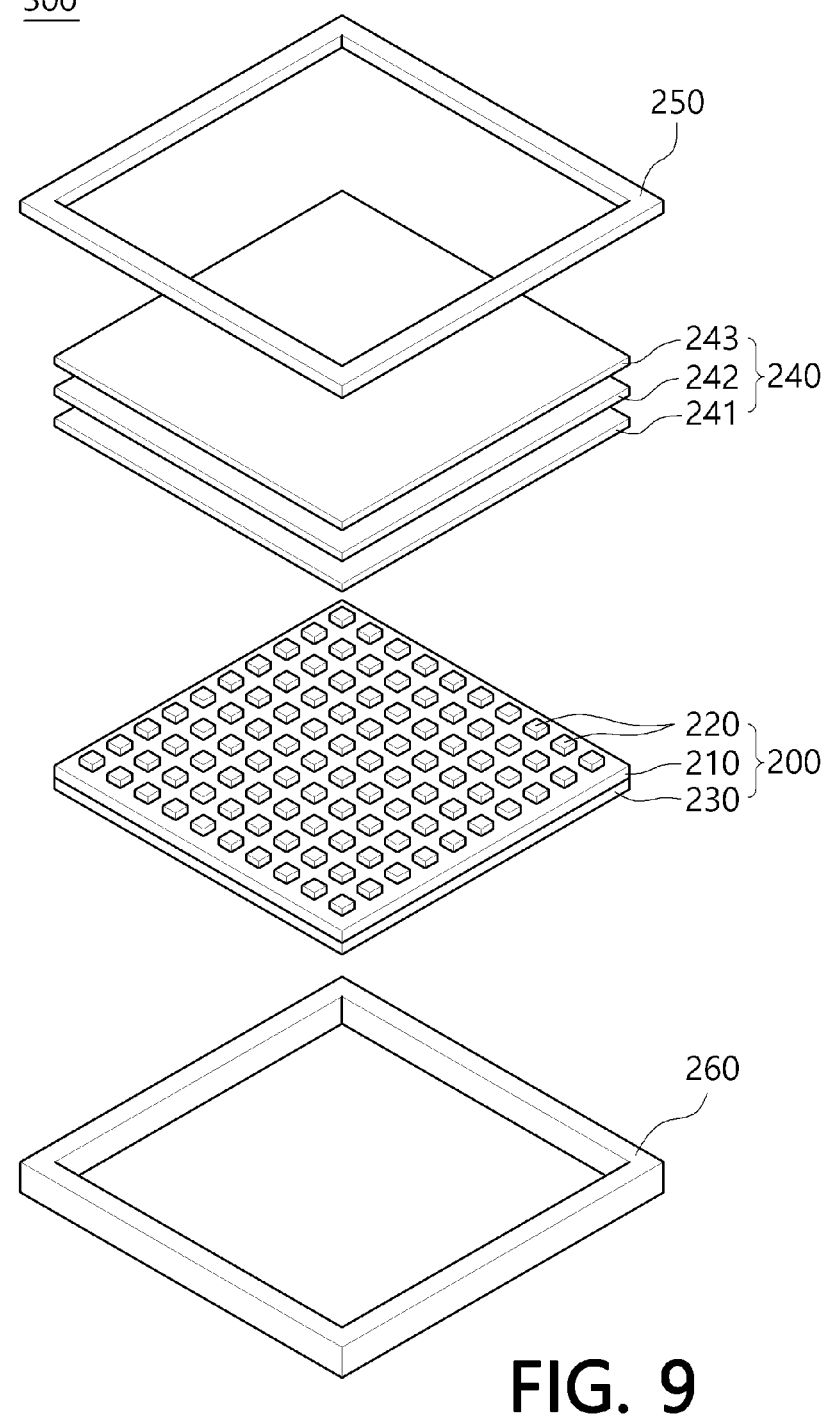
FIG. 9 is an exploded perspective view of an insulation backlight unit according to an exemplary embodiment of the present invention.
Figure 10:
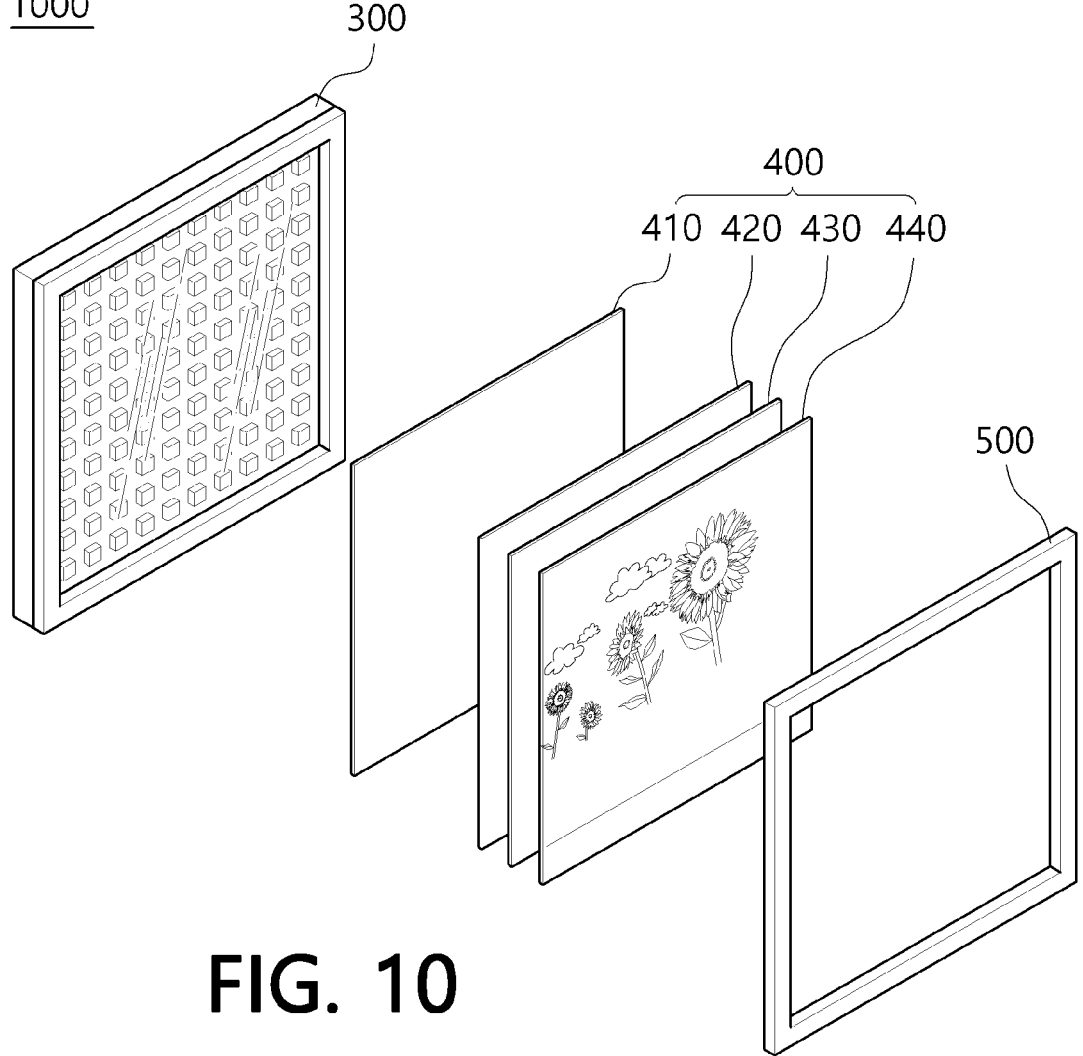
FIG. 10 is an exploded perspective view of a liquid crystal display device according to an exemplary embodiment of the present invention.

When this is described with reference to FIG. 9, the insulation backlight unit 300 is implemented by including an insulation light source module 200 and a plurality of optical sheets 240 that are disposed on an emitting surface of the insulation light source module 200. In addition, an intermediate molding material 250 for supporting and fixing the insulation light source module 200 and the optical sheet 240 and a lower case 260 for accommodating the insulation light source module may be further provided.

The optical sheet 240 is for improving the intensity, direction and the like of the light supplied to the liquid crystal display panel 400 through the light source modules 200, 200', 200", and it may be used without limitation if it is a known optical sheet used in a display backlight unit. For example, the optical sheet 240 may include a diffusion sheet 241, a prism sheet 242 and a reflective polarization sheet 243, and each sheet may be an optical sheet commonly used in the art. In addition, the optical sheet 240 may further include a sheet for performing other functions in addition to the diffusion sheet 241, the prism sheet 242 and the reflective polarizing sheet 243, or any one or more of these sheets may be omitted. In addition, the optical sheet may be provided with a plurality of sheets of a specific type, and the stacking order of each sheet may be different depending on the purpose, and thus, the present invention does not particularly limit the same.

In this case, in the insulation backlight unit 300, an air layer may be spaced apart between the insulation sheet 230 positioned on the opposite surface of the light emitting surface and the lower case 260, and through this, it is possible to minimize the transfer of a large amount of heat to the lower case side.

In addition, the liquid crystal display panel 400 may be disposed on the light emitting surface of the above-described heat insulation backlight unit 300 to implement a liquid crystal display device 1000. In addition, the liquid crystal display device may further include an upper case 500 for supporting the front edge of the liquid crystal display panel 400.

The liquid crystal display panel 400 may include a color conversion film layer 410 for converting light emitted from the insulation backlight unit 300 to a desired color, a liquid crystal layer 430 and a lower substrate 420 and an upper substrate 440 for supporting the liquid crystal layer in the upper and lower portions. The color conversion film layer 410 may be used without limitation if it is a color conversion film layer 410 employed in a known liquid crystal display device, and it may be, for example, a fluorescence conversion film or a quantum dot conversion film. In addition, the liquid crystal layer 430 may be a liquid crystal layer employed in a liquid crystal display device, and the present invention does not particularly limit the same.

Meanwhile, although the color conversion film layer 410 has been described as one configuration of the liquid crystal display panel 400, the present invention is not limited thereto, and it is noted that the color conversion film layer 410 may be provided in a liquid crystal display panel as an independent component from the liquid crystal display panel 400.

In addition, the lower substrate 420 may include a plurality of pixel electrodes (not illustrated) and a plurality of thin film transistors (not illustrated) that are electrically connected to the pixel electrodes in a one-to-one correspondence. Each thin film transistor switches a driving signal that is provided to a corresponding pixel electrode side. In addition, the upper substrate 440 may include a common electrode (not illustrated) that forms an electric field for controlling the arrangement of the liquid crystal together with the pixel electrodes.

In addition, configurations that are employed in known liquid crystal display devices may be further included in addition to the above-described configurations, and the detailed description thereof will be omitted in the present invention.

Meanwhile, unlike the liquid crystal display device, which is a light-receiving display device as described above, the insulation light source module of the present invention may be implemented as a light-emitting display device. According to an exemplary embodiment of the present invention, the LED element included in the insulation light source module is an LED element that emits white, UV or blue light, and it may further include a color conversion unit that is disposed on a path of light emitted from the insulation light source module, so as to express a desired predetermined color.

Alternatively, the plurality of LED elements included in the insulation light source module may include LED elements emitting red, green and blue light.

Although an exemplary embodiment of the present invention has been described above, the spirit of the present invention is not limited to the exemplary embodiments presented herein, and those skilled in the art who understand the spirit of the present invention may easily suggest other exemplary embodiments by modifying, changing, deleting or adding components within the scope of the same spirit, but this will also fall within the scope of the present invention.

The invention claimed is:

1. An insulation sheet for a display light source, wherein the insulation sheet is provided on an opposite surface opposite to a circuit board mounting surface, LED elements configuring a light source of a display are mounted on the circuit board mounting surface and spaced a predetermined interval apart from each other, heat generated from the LED elements is blocked from being transmitted in a direction perpendicular to the opposite surface, the insulation sheet comprising:

an adhesive member, wherein the adhesive member is a double-sided metal tape, the double-sided metal tape is attached on the opposite surface opposite to the circuit board mounting surface and includes a metal substrate for forming a hot spot having an area larger than a mounting area for each LED device and having thermal reliability and an adhesive layer on both surfaces of the metal substrate, wherein a thickness of the metal substrate is 7 to 75 μm; and an insulation member, wherein the insulation member is a graphite sheet, the graphite sheet is disposed on the adhesive member and includes a first surface perpendicular to a thickness direction and a second surface facing to the first surface, and has a function of minimizing heat transfer from the second surface toward a direction perpendicular to the second surface by moving the heat transferred toward the first surface adjacent to the adhesive member in the thickness direction and in a plane direction perpendicular to the thickness direction to lower a temperature of the LED elements, and predominantly moving the heat in the plane direction rather than the thickness direction, wherein the insulation member is formed in a thickness range of 70 to 500 μm; and a protective member provided on the second surface of the insulation member, wherein the graphite sheet includes natural graphite, and wherein the insulation member and the metal substrate minimize overlap due to plane-direction spreading of the heat transferred from the LED elements, and wherein a length and a width of each of the protective member and the adhesive member are formed to be greater than a length and a width of the insulation member, four side surfaces parallel to the thickness direction of the insulation member are sealed through the protective member and the adhesive member.

2. The insulation sheet of claim 1, wherein the thickness range of the insulation member is 150 to 200 μm.

3. The insulation sheet of claim 1, wherein the metal substrate is a metal foil having at least one of copper foil and aluminum foil.

4. The insulation sheet of claim 1, wherein a thickness of the adhesive layer is 7 to 55 μm.

5. The insulation sheet of claim 1, wherein the graphite sheet is provided with a ratio (a/b) of thermal conductivity (a) in the plane direction to thermal conductivity (b) in the thickness direction of 100 or less, the heat is minimized by being transferred from any one LED element and each of the other LED elements disposed adjacent to the one LED element to be transferred in each plane direction, from overlapping each other.

6. The insulation sheet of claim 1, further comprising:

an adhesive layer for fixing to the insulation member on one surface of the protective member, wherein the protective member is a protective film, and the protective film comprises at least one selected from the group consisting of polyimide, polyethylene terephthalate (PET) and polyethylene naphthalate (PEN).

7. The insulation sheet of claim 1, wherein the protective member has a thickness of 50 to 200 μm.

8. An insulation light source module, comprising:

a circuit board;

LED elements mounted on one surface of the circuit board at predetermined intervals from each other; and the insulation sheet according to claim 1, wherein the adhesive member is disposed on an opposite surface opposite to one surface of the circuit board.

9. The insulation light source module of claim 8, wherein the LED elements are mini LED elements or micro LED elements.

10. The insulation light source module of claim 8, wherein the insulation sheet is disposed by one or more sheets to cover the opposite surface corresponding to positions of the LED elements.

11. An insulation backlight unit, comprising:

the insulation light source module according to claim 8; and optical sheets disposed on a light exit surface of the insulation light source module.

12. The insulation backlight unit of claim 11, further comprising:

a lower case for accommodating part or all of a side surface of the insulation light source module and one surface on a side of the insulation sheet in the insulation light source module, wherein the insulation sheet and the lower case are spaced apart, and an air layer is formed between the insulation sheet and the lower case.

* * * * *